(12) United States Patent
Torres

(10) Patent No.: US 7,417,437 B1
(45) Date of Patent: Aug. 26, 2008

(54) VEHICLE BATTERY TESTING ASSEMBLY

(76) Inventor: Felix H. Torres, 81-447 Fuchsia Ave., Indio, CA (US) 92201

( * ) Notice: Subject to any disclaimer, the term of this patent is extended or adjusted under 35 U.S.C. 154(b) by 319 days.

(21) Appl. No.: 11/087,418

(22) Filed: Mar. 24, 2005

(51) Int. Cl.
*G01N 27/416* (2006.01)
*G01R 31/00* (2006.01)
*H02J 7/00* (2006.01)
*B62B 9/04* (2006.01)
*B62B 1/00* (2006.01)

(52) U.S. Cl. ............... 324/426; 324/433; 324/504; 320/101; 320/105; 280/24; 280/26; 280/27; 280/35; 280/19; 280/47.24; 280/47.26; 280/47.27; 280/47.35; 280/47.19

(58) Field of Classification Search ............... 320/101, 320/105; 324/426, 433, 504; 280/24, 26, 280/27, 35, 19, 47.24, 47.26, 47.27, 47.35, 280/47.19
See application file for complete search history.

(56) References Cited

U.S. PATENT DOCUMENTS

| | | | | |
|---|---|---|---|---|
| 3,638,108 A * | 1/1972 | Channing | ............... | 324/433 |
| 4,215,306 A * | 7/1980 | Mace | ............... | 320/105 |
| 4,315,217 A | 2/1982 | Sharber | | |
| 4,547,722 A * | 10/1985 | Sarlo | ............... | 324/504 |
| 5,039,930 A * | 8/1991 | Collier et al. | ............... | 320/105 |
| 5,111,127 A * | 5/1992 | Johnson | ............... | 320/101 |
| 5,202,617 A | 4/1993 | Nor | | |
| 5,327,066 A | 7/1994 | Smith | | |
| 5,378,005 A * | 1/1995 | Norton | ............... | 280/47.26 |
| 5,548,200 A | 8/1996 | Nor et al. | | |
| D382,853 S | 8/1997 | Crawford | | |
| 6,880,851 B1 * | 4/2005 | Summers et al. | ............... | 280/652 |
| 2003/0042828 A1 * | 3/2003 | Bonin | ............... | 312/245 |
| 2005/0099102 A1 * | 5/2005 | Villarreal | ............... | 312/237 |

* cited by examiner

*Primary Examiner*—Matthew V Nguyen
*Assistant Examiner*—Jue Zhang

(57) ABSTRACT

A portable assembly includes a multi-level housing having a vertically oriented back wall and an elongated rectilinear axle conjoined thereto. The housing further includes an elongated handle having a lower end portion monolithically formed with the back wall. A plurality of rotatable wheels operably communicate with the axle end portions and a plurality of coextensive shelves are conjoined to the back wall. The assembly further includes a mechanism for testing a variety of battery charging systems. The testing mechanism includes a plurality of power receptacles integrally connected to the back wall and spaced above a top one of the shelves. A battery-charger testing device is nested on one of the shelves for testing 48 volt club car power drive chargers. The battery-charger testing device is provided with a plurality of fuses for testing 36 volt and 48 volt circuits respectively.

18 Claims, 3 Drawing Sheets

VEHICLE BATTERY TESTING ASSEMBLY

CROSS REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Technical Field

This invention relates to battery testing devices and, more particularly, to a a portable assembly for assisting a technician to test the operability of a battery charging system commonly employed in golf carts and the like.

2. Prior Art

Often an electrically driven vehicle will appear to be fully charged but the batteries may fail after a short period of use due to a defective battery in the series. This can lead to a difficult situation when a golf cart fails on the back side of the course where a tow vehicle then must be employed to remove the cart to the club house for repairs. Further, this creates loss of revenues for the golf course and annoyance for the golfer, resulting in fewer repeat visits by the golfer.

Fast charging of batteries are now becoming well known. Electric vehicles are now becoming more popular for a variety of reasons. Indeed, electric vehicles may become mandated to a greater or lesser extent due to the imposition of regulations requiring that at least a certain percentage of vehicles sold by any one manufacturer of vehicles—especially, passenger cars with seating from two to nine passengers, including the driver—and which are conventionally powered by internal combustion engines, must also include a specific number of vehicles that are so-called "zero emission" vehicles. That means that such vehicles have no emissions of noxious gasses, and the most common type of vehicle which would meet such stringent standards is an electric vehicle. Electric vehicles are powered by batteries, and present a number of problems or other difficulties to be overcome.

Not the least among those problems is the fact that in order for an electric vehicle to have any reasonable range—the distance that it can be driven—there has to be significant energy storage by way of batteries onboard the vehicle. As the vehicle is driven, it removes energy from the batteries, converting it to driving power delivered to the wheels of the vehicle, and thus there is only a finite distance or period of time over which the vehicle can be operated without requiring that the batteries be recharged.

Other related conditions also arise in respect of fleets of vehicles that are privately or corporately owned, but which may have differing purposes. For example, large manufacturing plants, distribution warehouses, and the like, may have a very considerable number of battery powered fork lift trucks, other traction or towing devices, and so on. Golf courses usually have a large number of golf carts to be rented by golfers playing a round of golf—indeed, some courses require that the players utilize a golf cart. Other such fleets may be localized, such as mail or courier package delivery carts that operate in a localized delivery route, day after day.

As the use of electric vehicles becomes more widespread, there will be a growing need for portable testing and charging systems. In the case of an electric vehicle, however, instead of gasoline being placed into the fuel tank of the car, electrical energy is transferred into the batteries of the vehicle.

Accordingly, a need remains for a portable assembly to overcome the above-noted shortcomings. The present invention satisfies such a need by providing a portable battery testing and charging assembly for use with golf carts and other electric vehicles. Such a device would be convenient, easy to use and efficient. It would provide users with a means for quickly and easily jump starting their electric carts without the necessity of having another similar cart alongside to perform the "jump." As a result, a user would not have to fear being stranded at a remote location, making the use of such carts more attractive to consumers, and thereby expanding their use and the productivity and enjoyment of those who use them.

BRIEF SUMMARY OF THE INVENTION

In view of the foregoing background, it is therefore an object of the present invention to provide an apparatus for a portable assembly for assisting a technician to test the operability of a battery charging system commonly employed in golf carts and the like. These and other objects, features, and advantages of the invention are provided by an assembly including a multi-level housing having a vertically oriented back wall and an elongated rectilinear axle conjoined thereto. The rectilinear axle is provided with opposed end portions laterally spanning away from the back wall and terminating at a selected distance registered subjacent to a bottom portion of the back wall.

The housing further includes an elongated handle having a lower end portion monolithically formed with the back wall and extending rearwardly therefrom at an angle offset from a vertical axis such that the operator may readily pivot the housing between equilibrium and biased positions.

A plurality of rotatable wheels operably communicate with the axle end portions and are juxtaposed adjacent to opposite sides of the back wall such that the housing can be selectively articulated about the rectilinear axle while the wheels maintain continuous contact with a ground surface during transit. The wheels are formed from solid rubber material such that the housing can adequately support a weight of the testing mechanism (described herein below) during transit.

A plurality of coextensive shelves are conjoined to the back wall and spaced along a longitudinal length thereof wherein the shelves protrude normal to the back wall and have front end portions terminating forwardly of the wheels. The shelves are juxtaposed adjacent to a lower portion of the housing.

The present invention further includes a mechanism for testing a variety of battery charging systems such that an operator can determine whether the battery charging systems are working properly without requiring the presence of the vehicles during testing operations.

The testing mechanism includes a plurality of power receptacles integrally connected to the back wall and spaced above a top one of the shelves. The power receptacles are accessible from a front portion of the housing. A battery-charger testing device is nested on one of the shelves for testing 48 volt club car power drive chargers. The battery-charger testing device may be provided with a plurality of fuses for testing 36 volt and 48 volt circuits respectively.

The testing mechanism further includes a battery pack including a plurality of electrically coupled 12 volt batteries such that the battery can readily accommodate the 36 volt and 48 volt circuits. A rigid support beam having opposed end portions may be securely conjoined to the front end portions of the shelves such that the battery-charger testing device and the battery pack can be maintained at a substantially stable position during operating conditions. The plurality of power receptacles preferably include a crows foot receptacle for accommodating 36 volt power charging cords and a 48 volt Yamaha receptacle for accommodating Yamaha golf carts.

The plurality of power receptacles further preferably include a SB plug for accommodating 36 volt and 48 volt power charging cords, a 48 volt club car receptacle for accommodating power drive charging cords, a three-prong receptacle for accommodating 36 volt golf carts employing manual chargers, and an E-Z GO receptacle for accommodating E-Z GO golf carts employing power drive charging cords. The back wall further preferably includes an inverted U-shaped steel tubing monolithically formed with the axle and defining a longitudinal height of the back wall.

It is noted the purpose of the foregoing abstract is to enable the U.S. Patent and Trademark Office and the public generally, especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE SEVERAL VIEWS OF THE DRAWING

The novel features believed to be characteristic of this invention are set forth with particularity in the appended claims. The invention itself, however, both as to its organization and method of operation, together with further objects and advantages thereof, may best be understood by reference to the following description taken in connection with the accompanying drawings in which:

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that this application will be thorough and complete, and will fully convey the true scope of the invention to those skilled in the art. Like numbers refer to like elements throughout the figures.

Figure 1:
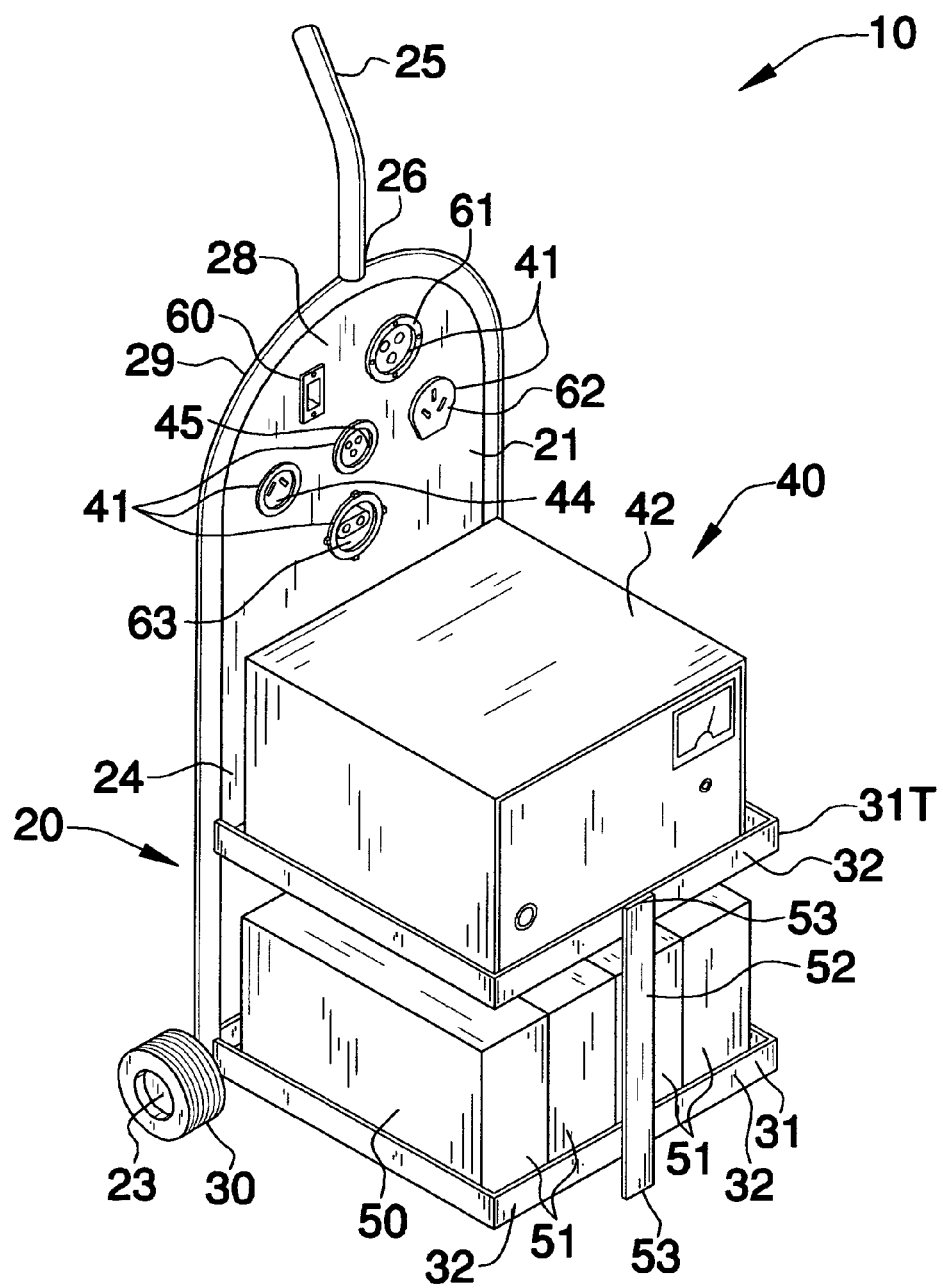
FIG. 1 is a perspective view showing a portable vehicle battery testing assembly, in accordance with the present invention.
Figure 2:
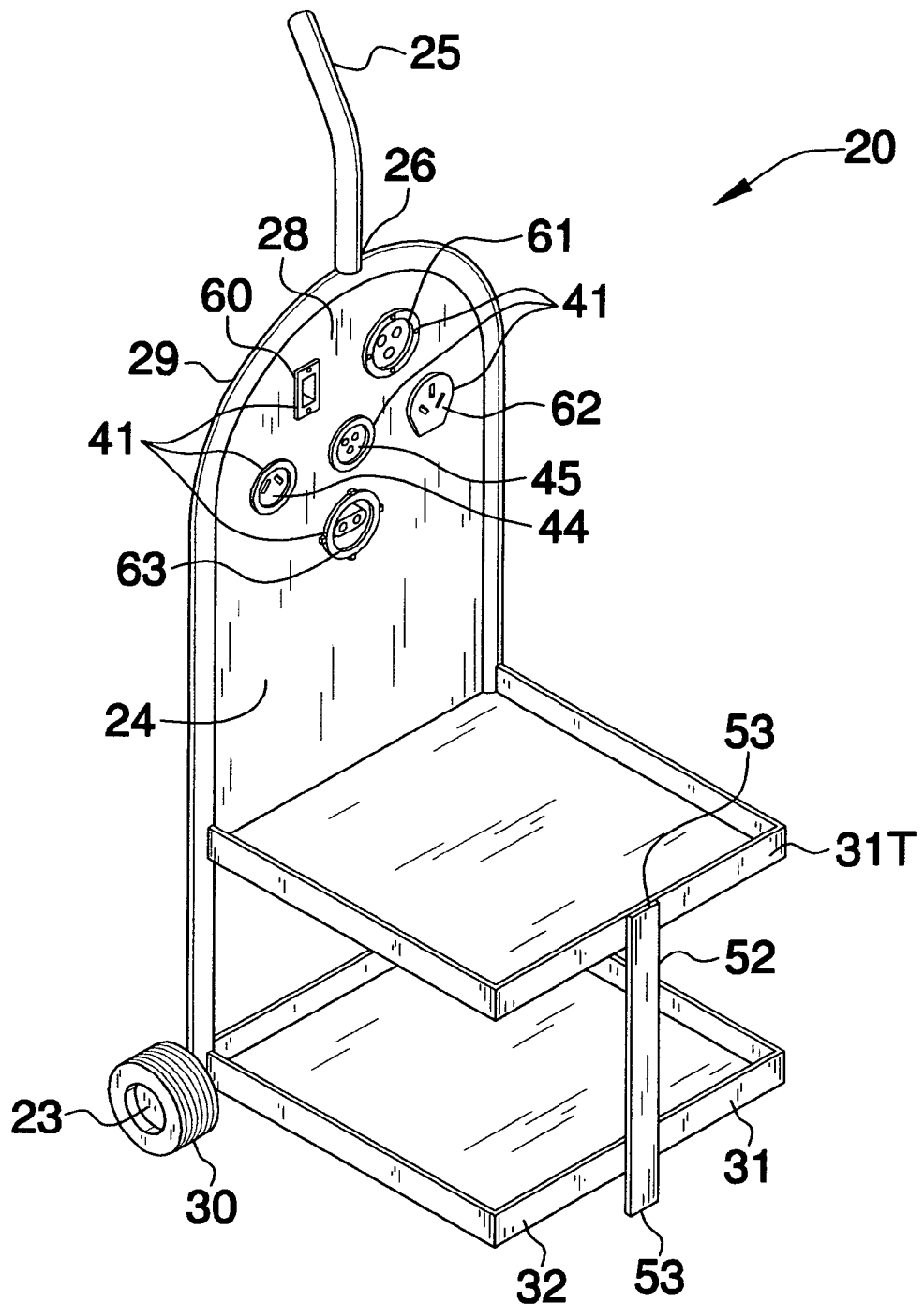
FIG. 2 is a perspective view of the present invention shown in FIG. 1, absent the battery charger testing device and battery pack.
Figure 3:
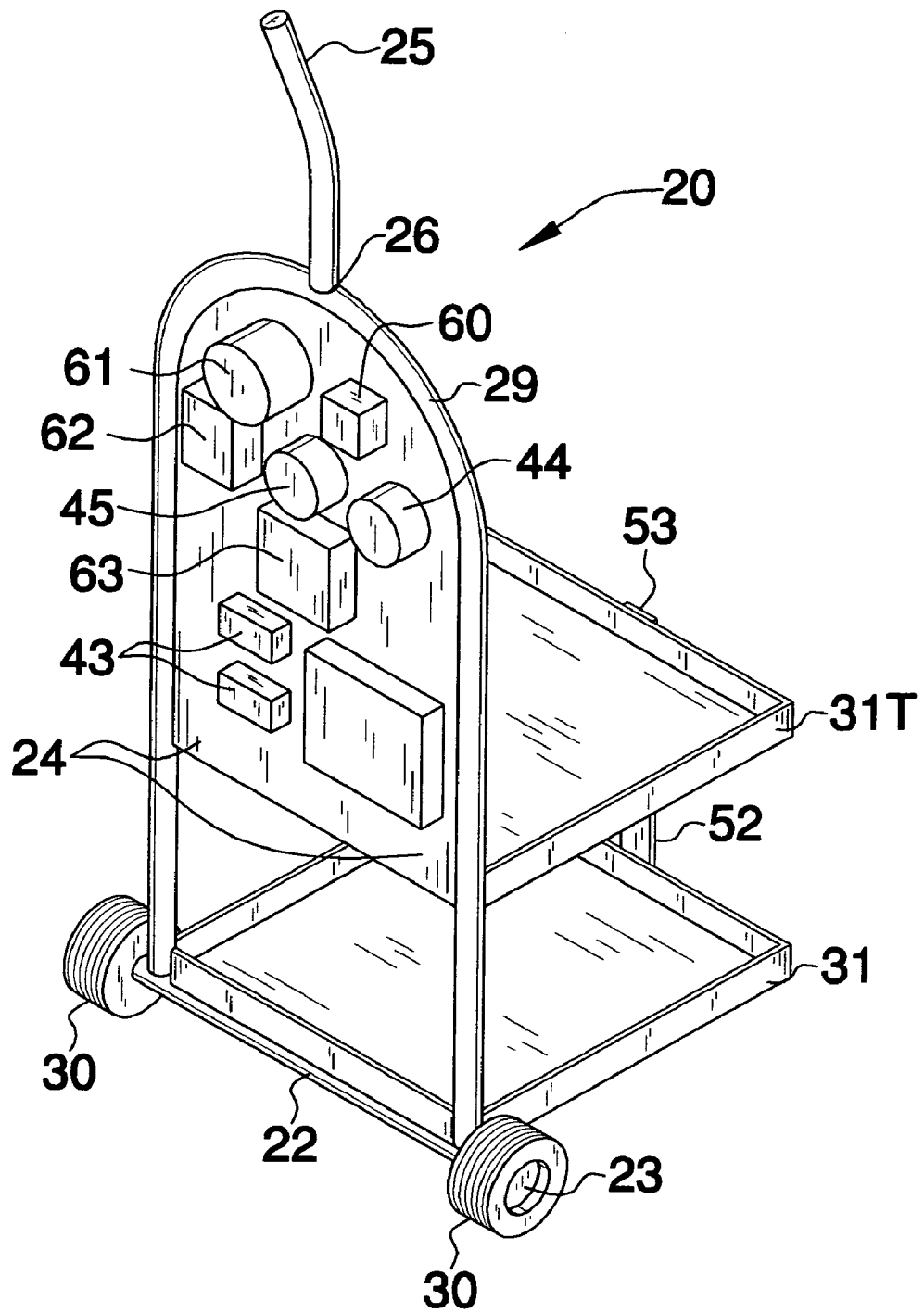
FIG. 3 is a rear perspective view of the invention shown in FIG. 2, showing the back wall and the plurality of fuses and power receptacles.

The apparatus of this invention is referred to generally in FIGS. 1-3 by the reference numeral 10 and is intended to provide a portable assembly for assisting a technician to test the operability of a battery charging system commonly employed in golf carts and the like. It should be understood that the apparatus 10 may be used to test many different types of battery charging systems in many different types of vehicles and should not be limited to only use with golf carts.

Initially referring to FIGS. 1-3, the assembly 10 includes a multi-level housing 20 having a vertically oriented back wall 21 and an elongated rectilinear axle 22 conjoined thereto. The rectilinear axle 22 is provided with opposed end portions 23 laterally spanning away from the back wall 21 and terminating at a selected distance registered subjacent to a bottom portion 24 of the back wall 21. The housing 20 further includes an elongated handle 25 having a lower end portion 26 monolithically formed with the back wall 21 and extending rearwardly therefrom at an angle offset from a vertical axis such that the operator may readily pivot the housing 20 between equilibrium and biased positions.

Still referring to FIGS. 1-3, a plurality of rotatable wheels 30 operably communicate with the axle end portions 23 and are juxtaposed adjacent to opposite sides of the back wall 21 such that the housing 20 can be selectively articulated about the rectilinear axle 22 while the wheels 30 maintain continuous contact with a ground surface during transit. The wheels 30 are preferably formed from solid rubber material such that the housing 20 can adequately support a weight of the testing mechanism (described herein below) during transit. A plurality of preferably coextensive shelves 31 are conjoined to the back wall 21 and spaced along a longitudinal length thereof wherein the shelves 31 protrude normal to the back wall 21 and have front end portions 32 terminating forwardly of the wheels 30.

The shelves 31 are juxtaposed adjacent to a lower portion of the housing 20. By tilting the assembly 10 backward, the portable tester could be moved about similar to a dolly. The portability of the assembly 10 enables a technician to easily transport the assembly 10 to a disabled golf cart at a remote location on the course, thus eliminating the necessity of towing it into a repair shop and increasing productivity and efficiency. This saves the owner time and money and further ensures that such carts are quickly and easily returned to service. Without such a device, a technician might not be able to properly diagnose the problem in the field, creating more downtime for the cart.

Now referring to FIG. 2, the present invention 10 further includes a mechanism 40 for testing a variety of battery charging systems such that an operator can determine whether the battery charging systems are working properly without requiring the presence of the vehicles during testing operations. The testing mechanism 40 includes a plurality of power receptacles 41 integrally connected to the back wall 21 and spaced above a top one 31T of the shelves 31. The power receptacles 41 are preferably accessible from a front portion 28 of the housing 20. A battery-charger testing device 42 is nested on one of the shelves for testing 48 volt club car power drive chargers. The battery-charger testing device 42 is provided with a plurality of fuses 43 for testing 36 volt and 48 volt circuits respectively.

Still referring to FIG. 2, the testing mechanism 40 further includes a battery pack 50 including a plurality of electrically coupled 12 volt batteries 51 such that the battery pack 50 can readily accommodate the 36 volt and 48 volt circuits. A rigid support beam 52 having opposed end portions 53 may be securely conjoined to the front end portions 32 of the shelves 31 such that the battery-charger testing device 42 and the battery pack 50 can be maintained at a substantially stable position during operating conditions. Because battery charging devices and the associated battery pack are very heavy, the rigid support beam must be securely conjoined to provide stability and support. Such a support beam is preferably formed from steel or other durable and strong material to provide the necessary support. As a result, the assembly 10 would be capable of jump starting disabled golf carts, aiding golfers who may be stranded at remote locations on the course, and eliminating the need to tow the cart into the shop.

Referring back to FIGS. 1-3, the plurality of power receptacles 41 preferably include a crows foot receptacle 44 for accommodating 36 volt power charging cords and a 48 volt Yamaha receptacle 45 for accommodating Yamaha golf carts. The plurality of power receptacles 41 preferably further include a SB plug 60 for accommodating 36 volt and 48 volt power charging cords, a 48 volt club car receptacle 61 for accommodating power drive charging cords, a three-prong receptacle 62 for accommodating 36 volt golf carts employing manual chargers, and an E-Z GO receptacle 63 for accommodating E-Z GO golf carts employing power drive charging cords.

Advantageously, the assembly 10 includes a plurality of power receptacles 41 for most common manufacturers, conveniently combining a testing mechanism for all makes and models into one assembly 10. The back wall 21 preferably further includes an inverted U-shaped steel tubing 29 monolithically formed with the axle 22 and defining a longitudinal height of the back wall 21. The plurality of power receptacles 41 enable a technician to use one piece of equipment to test and analyze the entire fleet of golf carts. Heretofore, this may not have been possible because a fleet often includes carts of multiple manufacturers, and therefore, a technician may have been forced to analyze and jump start, or charge such carts using a similar make and model cart, assuming one is available at the time. Golf courses prefer to have the carts being utilized, rather than just sitting around because they represent a sizable investment that must provide a return on investment and should not sit idle.

The assembly 10 is very simple and easy to use, enabling unskilled or clerical employees such as a receptionist, clerk, or trainee to operate. This is especially important because trained repair technicians may not be available on the weekends when the golf courses are the busiest and the usage of golf carts is often at its maximum level. The assembly 10 would be versatile and reliable, thereby improving customer satisfaction and impressing patrons who suffer a breakdown and may be frustrated or expecting a long wait time for service.

While the invention has been described with respect to a certain specific embodiment, it will be appreciated that many modifications and changes may be made by those skilled in the art without departing from the spirit of the invention. It is intended, therefore, by the appended claims to cover all such modifications and changes as fall within the true spirit and scope of the invention.

In particular, with respect to the above description, it is to be realized that the optimum dimensional relationships for the parts of the present invention may include variations in size, materials, shape, form, function and manner of operation. The assembly and use of the present invention are deemed readily apparent and obvious to one skilled in the art.

What is claimed as new and what is desired to secure by Letters Patent of the United States is:

1. A portable assembly for assisting a technician to test the operability of a battery charging system commonly employed in golf carts and the like, said assembly comprising:
   a multi-level housing having a vertically oriented back wall and an elongated rectilinear axle conjoined thereto, said rectilinear axle being provided with opposed end portions laterally spanning away from said back wall and terminating at a selected distance registered subjacent a bottom portion of said back wall, wherein said back wall forms a substantially planar surface;
   a plurality of rotatable wheels operably communicating with said axle end portions and be juxtaposed adjacent opposite sides of said back wall such that said housing can be selectively articulated about said rectilinear axle while said wheels maintain continuous contact with a ground surface during transit;
   a plurality of shelves directly conjoined to said back wall and spaced along a longitudinal length thereof wherein said shelves protrude normal to said back wall and have front end portions terminating forwardly of said wheels; and
   means for testing a variety of battery charging systems such that an operator can determine whether the battery charging systems are working properly without requiring the presence of the vehicles during testing operations.

2. The assembly of claim 1, wherein said testing means comprises:
   a plurality of power receptacles integrally connected to said back wall and spaced above a top one of said shelves, said power receptacles being accessible from a front portion of said housing;
   a battery-charger testing device nested on one said shelves for testing 48 volt club car power drive chargers, said battery-charger testing device being provided with a plurality of fuses for testing 36 volt and 48 volt circuits respectively;
   a battery pack including a plurality of electrically coupled 12 volt batteries such that said battery pack can readily accommodate the 36 volt and 48 volt circuits; and
   a rigid support beam having opposed end portions securely conjoined to said front end portions of said shelves such that said battery-charger testing device and said battery pack can be maintained at a substantially stable position during operating conditions.

3. The assembly of claim 2, wherein said plurality of power receptacles comprise:
   a crows foot receptacle for accommodating 36 volt power charging cords;
   a 48 volt receptacle for accommodating golf carts;
   a plug for accommodating 36 volt and 48 volt power charging cords;
   a 48 volt club car receptacle for accommodating power drive charging cords;
   a three-prong receptacle for accommodating 36 volt golf carts employing manual chargers; and
   a receptacle for accommodating golf carts employing power drive charging cords.

4. The assembly of claim 1, wherein said wheels are formed from solid rubber material such that said housing can adequately support a weight of said testing means during transit.

5. The assembly of claim 1, wherein said back wall further comprises:
   an inverted U-shaped steel tubing monolithically formed with said axle and defining a longitudinal height of said back wall.

6. The assembly of claim 1, wherein said shelves are coextensive.

7. A portable assembly for assisting a technician to test the operability of a battery charging system commonly employed in golf carts and the like, said assembly comprising:
   a multi-level housing having a vertically oriented back wall and an elongated rectilinear axle conjoined thereto, said rectilinear axle being provided with opposed end portions laterally spanning away from said back wall and terminating at a selected distance registered subjacent a bottom portion of said back wall, wherein said back wall forms a substantially planar surface;
   a plurality of rotatable wheels operably communicating with said axle end portions and be juxtaposed adjacent opposite sides of said back wall such that said housing can be selectively articulated about said rectilinear axle while said wheels maintain continuous contact with a ground surface during transit;

a plurality of shelves directly conjoined to said back wall and spaced along a longitudinal length thereof wherein said shelves protrude normal to said back wall and have front end portions terminating forwardly of said wheels, said shelves being juxtaposed adjacent to a lower portion of said housing; and means for testing a variety of battery charging systems such that an operator can determine whether the battery charging systems are working properly without requiring the presence of the vehicles during testing operations.

8. The assembly of claim 7, wherein said testing means comprises:

a plurality of power receptacles integrally connected to said back wall and spaced above a top one of said shelves, said power receptacles being accessible from a front portion of said housing;

a battery-charger testing device nested on one said shelves for testing 48 volt club car power drive chargers, said battery-charger testing device being provided with a plurality of fuses for testing 36 volt and 48 volt circuits respectively;

a battery pack including a plurality of electrically coupled 12 volt batteries such that said battery pack can readily accommodate the 36 volt and 48 volt circuits; and a rigid support beam having opposed end portions securely conjoined to said front end portions of said shelves such that said battery-charger testing device and said battery pack can be maintained at a substantially stable position during operating conditions.

9. The assembly of claim 8, wherein said plurality of power receptacles comprise:

a crows foot receptacle for accommodating 36 volt power charging cords;

a 48 volt receptacle for accommodating golf carts;

a plug for accommodating 36 volt and 48 volt power charging cords;

a 48 volt club car receptacle for accommodating power drive charging cords;

a three-prong receptacle for accommodating 36 volt golf carts employing manual chargers; and a receptacle for accommodating golf carts employing power drive charging cords.

10. The assembly of claim 7, wherein said wheels are formed from solid rubber material such that said housing can adequately support a weight of said testing means during transit.

11. The assembly of claim 7, wherein said back wall further comprises an inverted U-shaped steel tubing monolithically formed with said axle and defining a longitudinal height of said back wall.

12. The assembly of claim 7, wherein said shelves are coextensive.

13. A portable assembly for assisting a technician to test the operability of a battery charging system commonly employed in golf carts and the like, said assembly comprising:

a multi-level housing having a vertically oriented back wall and an elongated rectilinear axle conjoined thereto, said rectilinear axle being provided with opposed end portions laterally spanning away from said back wall and terminating at a selected distance registered subjacent a bottom portion of said back wall, wherein said back wall forms a substantially planar surface;

wherein said housing further comprises: an elongated handle having a lower end portion monolithically formed with said back wall and extending rearwardly therefrom at an angle offset from a vertical axis such that the operator may readily pivot said housing between equilibrium and biased positions;

a plurality of rotatable wheels operably communicating with said axle end portions and be juxtaposed adjacent opposite sides of said back wall such that said housing can be selectively articulated about said rectilinear axle while said wheels maintain continuous contact with a ground surface during transit;

a plurality of shelves directly conjoined to said back wall and spaced along a longitudinal length thereof wherein said shelves protrude normal to said back wall and have front end portions terminating forwardly of said wheels, said shelves being juxtaposed adjacent to a lower portion of said housing; and means for testing a variety of battery charging systems such that an operator can determine whether the battery charging systems are working properly without requiring the presence of the vehicles during testing operations.

14. The assembly of claim 13, wherein said testing means comprises:

a plurality of power receptacles integrally connected to said back wall and spaced above a top one of said shelves, said power receptacles being accessible from a front portion of said housing;

a battery-charger testing device nested on one said shelves for testing 48 volt club car power drive chargers, said battery-charger testing device being provided with a plurality of fuses for testing 36 volt and 48 volt circuits respectively;

a battery pack including a plurality of electrically coupled 12 volt batteries such that said battery pack can readily accommodate the 36 volt and 48 volt circuits; and a rigid support beam having opposed end portions securely conjoined to said front end portions of said shelves such that said battery-charger testing device and said battery pack can be maintained at a substantially stable position during operating conditions.

15. The assembly of claim 14, wherein said plurality of power receptacles comprise:

a crows foot receptacle for accommodating 36 volt power charging cords;

a 48 volt receptacle for accommodating golf carts;

a plug for accommodating 36 volt and 48 volt power charging cords;

a 48 volt club car receptacle for accommodating power drive charging cords;

a three-prong receptacle for accommodating 36 volt golf carts employing manual chargers; and a receptacle for accommodating golf carts employing power drive charging cords.

16. The assembly of claim 13, wherein said wheels are formed from solid rubber material such that said housing can adequately support a weight of said testing means during transit.

17. The assembly of claim 13, wherein said back wall further comprises:

an inverted U-shaped steel tubing monolithically formed with said axle and defining a longitudinal height of said back wall.

18. The assembly of claim 13, wherein said shelves are coextensive.

* * * * *